US006956293B2

(12) United States Patent
Takaike

(10) Patent No.: US 6,956,293 B2
(45) Date of Patent: Oct. 18, 2005

(54) SEMICONDUCTOR DEVICE

(75) Inventor: Eiji Takaike, Nagano (JP)

(73) Assignee: Shinko Electric Industries, Ltd., Nagano (JP)

( * ) Notice: Subject to any disclaimer, the term of this patent is extended or adjusted under 35 U.S.C. 154(b) by 0 days.

(21) Appl. No.: 10/453,665

(22) Filed: Jun. 4, 2003

(65) Prior Publication Data

US 2003/0227096 A1 Dec. 11, 2003

(30) Foreign Application Priority Data

Jun. 7, 2002 (JP) ........................................ 2002-167229

(51) Int. Cl.[7] ......................... H01L 23/48; H01L 23/52; H01L 29/40

(52) U.S. Cl. ........................................ 257/781; 257/780

(58) Field of Search ................................. 257/780, 781, 257/784, 786, 735

(56) References Cited

U.S. PATENT DOCUMENTS

| | | | | |
|---|---|---|---|---|
| 5,172,212 A | * | 12/1992 | Baba | 257/738 |
| 5,293,073 A | * | 3/1994 | Ono | 257/740 |
| 5,422,516 A | * | 6/1995 | Hosokawa et al. | 257/775 |
| 5,640,052 A | * | 6/1997 | Tsukamoto | 257/781 |
| 5,914,536 A | * | 6/1999 | Shizuki et al. | 257/778 |
| 6,433,426 B1 | * | 8/2002 | Ikegami | 257/737 |
| 6,458,622 B1 | | 10/2002 | Keser et al. | 438/106 |
| 6,465,879 B1 | * | 10/2002 | Taguchi | 257/673 |
| 6,545,355 B2 | * | 4/2003 | Yanagida | 257/738 |
| 6,555,757 B2 | * | 4/2003 | Saiki et al. | 174/256 |
| 6,759,751 B2 | * | 7/2004 | Sinha | 257/779 |

FOREIGN PATENT DOCUMENTS

| | | |
|---|---|---|
| JP | 2001-57374 | 2/2001 |

* cited by examiner

*Primary Examiner*—S. V. Clark
(74) *Attorney, Agent, or Firm*—Armstrong, Kratz, Quintos, Hanson & Brooks, LLP

(57) ABSTRACT

There is provided a semiconductor device having a wafer-level package structure in which CSP structures are formed at a wafer level, which comprises a semiconductor substrate, an electrode pad formed over the semiconductor substrate, and a tail terminal formed to have an area that is smaller than the electrode pad and connected electrically to the electrode pad.

10 Claims, 17 Drawing Sheets

SEMICONDUCTOR DEVICE

BACKGROUND OF THE INVENTION

1. Field of the Invention

The present invention relates to a semiconductor device and, more particularly, a semiconductor device having a wafer-level package structure that makes it possible to execute the CSP (Chip Size Package) process on the wafer.

2. Description of the Related Art

In recent years, development of the LSI technology as the key technology to implement the multimedia equipments is proceeding steadily to the higher speed and the larger capacity of the data transmission. A higher density of the packaging technology as the interface between the LSI and the electronic equipment is also promoted pursuant to this progress.

As the IC package to meet such requirements, there is known the CSP (Chip Size Package) that is packaged in the almost same size as a chip size. In addition, there is known the wafer-level CSP from which individual CSP can be obtained by executing film formation, processing, etc. required for the CSP structure at the wafer stage and then dicing such wafer.

(Related Art 1)

FIGS. 1A to 1H are sectional views showing a bump forming method in the wafer-level CSP according to the related art 1. As shown in FIG. 1A, predetermined elements and multi-layered wirings (not shown) are formed on a semiconductor substrate 100. Then, electrode pads 104 are buried in an interlayer insulating film 102 as the multi-layered wirings. Then, a passivation film 106 is formed on the interlayer insulating film 102 to expose the electrode pads 104.

In the bump forming method in the wafer-level CSP according to the related art 1, as shown in FIG. 1B, first the semiconductor substrate 100 having the passivation structure is prepared. Then, a barrier conductive film 108 used also as a plating-power feeding layer is formed on the passivation film 106 and the electrode pads 104. Then, a first dry-film photoresist 110 is laminated on the barrier conductive film 108.

Then, as shown in FIG. 1C, opening portions 110*a* are formed on the barrier conductive film 108 in areas containing the electrode pads 104 by exposing/developing the first dry-film photoresist 110.

Then, as shown in FIG. 1D, a gold (Au) film, a copper (Cu) film, or the like is grown in the opening portions 110*a* of the first dry-film photoresist 110 by the electrolytic plating utilizing the barrier conductive film 108 as the plating-power feeding layer. Thus, metal bumps 112 are formed in the opening portions 110*a*.

Then, as shown in FIG. 1E, the first dry-film photoresist 110 is removed. Then, as shown in FIG. 1F, a second dry-film photoresist is laminated on the metal bumps 112 and the barrier conductive film 108, and then exposed/developed. Thus, resist masks 114*a* for covering upper surfaces and side surfaces of the metal bump 112 respectively are formed.

Then, as shown in FIG. 1G, the exposed barrier conductive film 108 is wet-etched by utilizing the resist masks 114*a* as a mask. At this time, the barrier conductive film 108 is side-etched into the insides of the resist masks 114*a*. Thus, barrier film patterns 108*a* are formed.

Then, as shown in FIG. 1H, the resist masks 114*a* are removed. Thus, metal bumps 112 that are connected electrically to the electrode pads 104 via the barrier film patterns 108*a* are formed.

(Relate Art 2)

FIGS. 2A and 2B are sectional views showing a bump forming method in the wafer-level CSP according to the related art 2. In the bump forming method in the wafer-level CSP according to the related art 2, as shown in FIG. 2A, first the semiconductor substrate 100 on which the elements and the multi-layered wirings, etc., which are similar to those in above FIG. 1A, are formed is prepared. Then, as shown in FIG. 2B, stud bumps 112*x* each having a pointed top end are formed on the electrode pads 104 by the wire bumping method.

In other words, a metal wire made of gold, or the like is pulled out from the capillary of the wire bonder by a predetermined length. Then, the top end portion of this metal wire is rounded like a ball by the electric discharge. Then, the ball-like top end portion of the metal wire is brought into contact with the electrode pad 104 by lowering the capillary. Then, the metal wire is jointed to the electrode pad 104 by applying the heat and the ultrasonic vibration.

Then, the metal wire is pulled off by fixing the metal wire by the clamper while pulling up the capillary. Thus, the stud bumps 112*x* that are connected electrically to the electrode pad 104 and have the pointed top end are formed.

(Related Art 3)

FIGS. 3A to 3H are sectional views showing a bump forming method in the wafer-level CSP according to the related art 3. In the bump forming method in the wafer-level CSP according to the related art 3, as shown in FIG. 3A, first the semiconductor substrate 100 on which the elements and the multi-layered wirings, etc., which are similar to those in above FIG. 1A, are formed is prepared. Then, as shown in FIG. 3B, the barrier conductive film 108 is formed on the passivation film 106 and the electrode pads 104.

Then, as shown in FIG. 3C, a photosensitive resist film is coated on the barrier conductive film 108, and then is exposed/developed. Thus, resist masks 114*a* are formed selectively on the barrier conductive film 108 in the areas containing the electrode pads 104.

Then, as shown in FIGS. 3D and 3E, exposed portions of the barrier conductive film 108 are wet-etched by utilizing the resist masks 114*a* as a mask. Then, the resist masks 114*a* are removed. Thus, barrier film patterns 108*a* that are connected electrically to the electrode pads 104 are formed.

Then, as shown in FIG. 3F, solder paste 116 is coated on the barrier film patterns 108*a* by the screen printing method, or the like. Then, as shown in FIG. 3G, solder balls 112*y* are put on the solder paste 116, and then reflow-heated. Thus, as shown in FIG. 3H, solder bumps 112*z* that are connected electrically to the electrode pads 104 via the barrier film patterns 108*a* are formed.

In the related art, according to the method such as one of the above-described related arts 1 to 3, etc., the metal bumps that are connected electrically to the electrode pads 104 are formed, and then the semiconductor substrate 100 is diced. Thus, the semiconductor devices each having the CSP structure are manufactured.

In the related art 1, when the metal bumps 112 are to be jointed to the connecting pads on the wiring substrate, the top end surfaces, which have a relatively large area, of the metal bumps 112 and the connecting pads are jointed together via the solder paste, or the like. Therefore, an amount of solder that is interposed between the metal bumps 112 and connecting pads is increased indispensably. As a result, there is caused such a problem that a thickness of the electronic parts in which the semiconductor device and the wiring substrate are jointed together is increased.

In addition, when the barrier film patterns 108*a* are formed by wet-etching the barrier conductive film 108, a depth of side-etching of the barrier conductive film 108 that comes into contact with the metal bump 112 is relatively large. Thus, the metal bumps 112 must be formed larger than the electrode pad 104 by estimating such depth of side-etching. Therefore, the method in the related art 1 cannot easily deal with the case that the pitch between the electrode pads 104 should be narrowed, and also it is possible that the metal bumps 112 come into contact with each other.

Also, in the related art 2, since the stud bumps 112*x* are formed by bonding the metal wire with the pressure, the area of the top end surface that is jointed to the connecting pad on the wiring substrate tends to reduce. Thus, there is such a possibility that reliability of the jointing is lowered. Also, since the wire-bonding equipment is used, there is a limit to the pitch between the formed stud bumps 112*x* and also there is a limit to the reduction in size of the stud bump 112*x* itself. As a result, the method in the related art 2 cannot easily deal with the case that the pitch between the electrode pads 104 should be narrowed.

Also, in the related art 3, since the solder balls 112*y* are employed, it is difficult to reduce the thickness of the electronic parts because of the same reason as the related art 1. Also, when the solder balls 112*y* are electrically jointed to the barrier conductive film 108 by the reflow-heating, such solder balls 112*y* are also re-flown in the lateral direction. As a result, the method in the related art 3 cannot easily deal with the case that the pitch between the electrode pads 104 should be narrowed, and also there is such a possibility that the solder bumps 112*z* come into contact with each other.

In this case, in Patent Application Publication (KOKAI) 2001-57374, the semiconductor device having the conductive bumps that are connected to the bonding pads on the semiconductor substrate is set forth. But no regard is paid to the above-mentioned problems.

SUMMARY OF THE INVENTION

It is an object of the present invention to provide a semiconductor device having a wafer-level CSP structure, capable of reducing a thickness of an electronic parts in which a semiconductor device and a wiring substrate are jointed together, and capable of dealing easily with a narrower pitch between electrode pads, and thus improving the reliability of the jointing to the wiring substrate.

The present invention is concerned with a semiconductor device having a wafer-level package structure in which CSP structures are formed at a wafer level, which comprises a semiconductor substrate; an electrode pad formed over the semiconductor substrate; and a tail terminal formed to have an area that is smaller than the electrode pad and connected electrically to the electrode pad.

In the present invention, the column-like tail terminal having an area smaller than that of the electrode pad is formed on the electrode pad of the semiconductor device in such a state that it is connected electrically to the electrode pad. For example, a diameter of the tail terminal is set to about ⅓ to ⅔ of a diameter of the electrode pad, and the tail terminal is formed on the center portion of the electrode pad.

Since such structure is employed, an area of a top end surface of the tail terminal can be reduced when the semiconductor device is mounted on the wiring substrate. Therefore, an amount of the jointing material such as the solder, which joints the tail terminal portion of the semiconductor device and the connecting pad of the wiring substrate, or the like can be reduced rather than the related art. In addition, since the jointing material is also formed around side surfaces of the tail terminal, not only the top end surface of the tail terminal but also the side surfaces thereof can act as the jointing portion. In other words, although an amount of the jointing material is reduced by employing the tail terminal having a diameter that is smaller than that of the electrode pad as the connecting electrode, the sufficient jointing area can be assured.

In this manner, while assuring the reliability of the jointing to the wiring substrate, an amount of the jointing material that is interposed between the semiconductor device and the wiring substrate can be reduced. Therefore, a thickness of the electronic parts in which the semiconductor device is mounted on the wiring substrate can be reduced.

Also, the structure in which the conductive body such as the jointing material, or the like seldom protrudes from the electrode pad area to the outside can be formed. Thus, even if the pitch between the electrode pads is narrowed, generation of the electric short circuit between the electrode pads can be prevented. Therefore, the present invention can easily deal with the narrower pitch between the electrode pads.

In one preferred mode of the present invention, the electrode pad and the tail terminal are covered with the barrier conductive film, and also the resin layer is formed to expose the tail terminal portion and its neighboring area.

According to this, since the electrode pad and the tail terminal are covered with the barrier conductive film, mutual diffusion of materials between the jointing material, the tail terminal, and the electrode pad can be prevented and also the reliability of the semiconductor device can be improved.

Also, since the resin layer is provided on the outside of the tail terminal such that areas containing the tail terminal are exposed, protrusion of the jointing material from the electrode pad area to the outside can be suppressed physically. Therefore, the present invention can deal with the much more narrow pitch between the electrode pads.

Otherwise, the structure in which the barrier conductive film is formed between the electrode pad and the tail terminal may be employed. In this case, even if the materials of the electrode pad and the tail terminal are different, mutual diffusion of these materials can be prevented and also the reliability of the semiconductor device can be improved.

BRIEF DESCRIPTION OF THE DRAWINGS

FIGS. 4A to 4L are partial sectional views showing sequentially a semiconductor device manufacturing method according to a first embodiment of the present invention, wherein FIG. 4F is a partial plan view showing a neighborhood of the tail terminal in FIG. 4E in plan;

DETAILED DESCRIPTION OF THE PREFERRED EMBODIMENTS

Embodiments of the present invention will be explained with reference to the drawings hereinafter.

(First Embodiment)

Figure 5A:
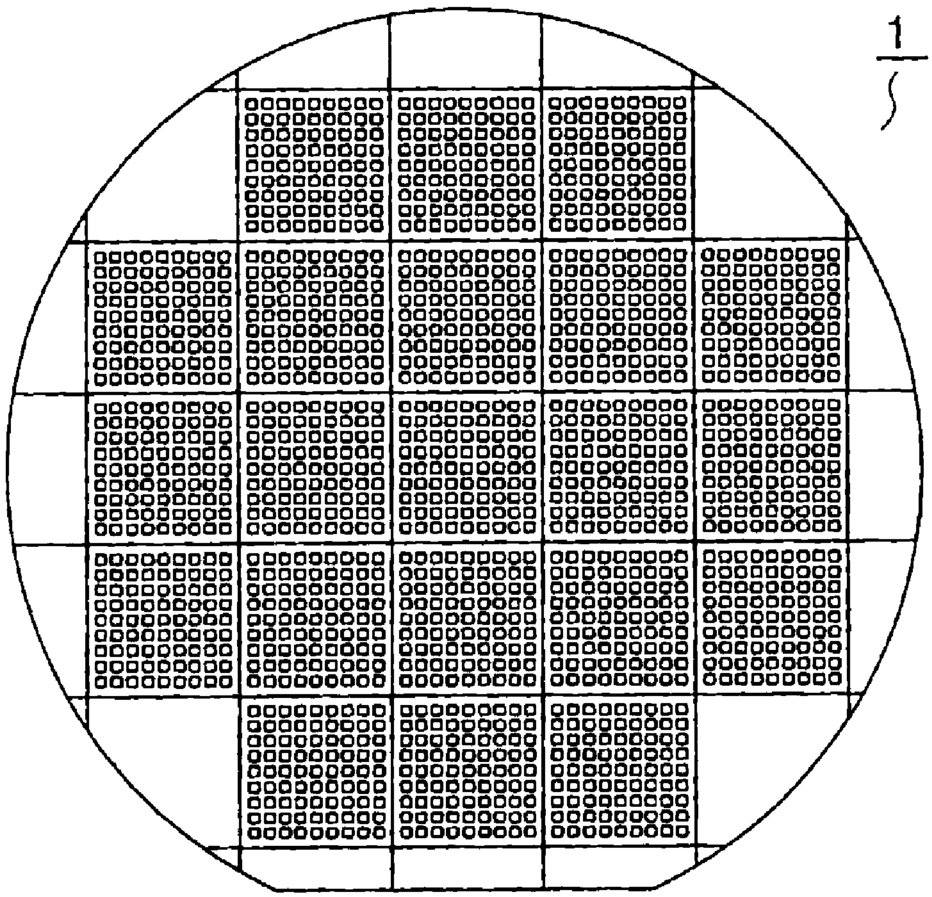
FIG. 5A is a plan view showing a semiconductor wafer having the CSP structure according to the first embodiment.
Figure 5B:
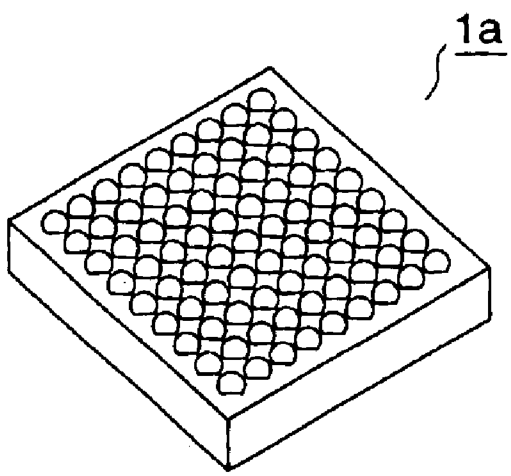
FIG. 5B is a perspective view showing a semiconductor chip having the CSP structure according to the first embodiment.
Figure 6:
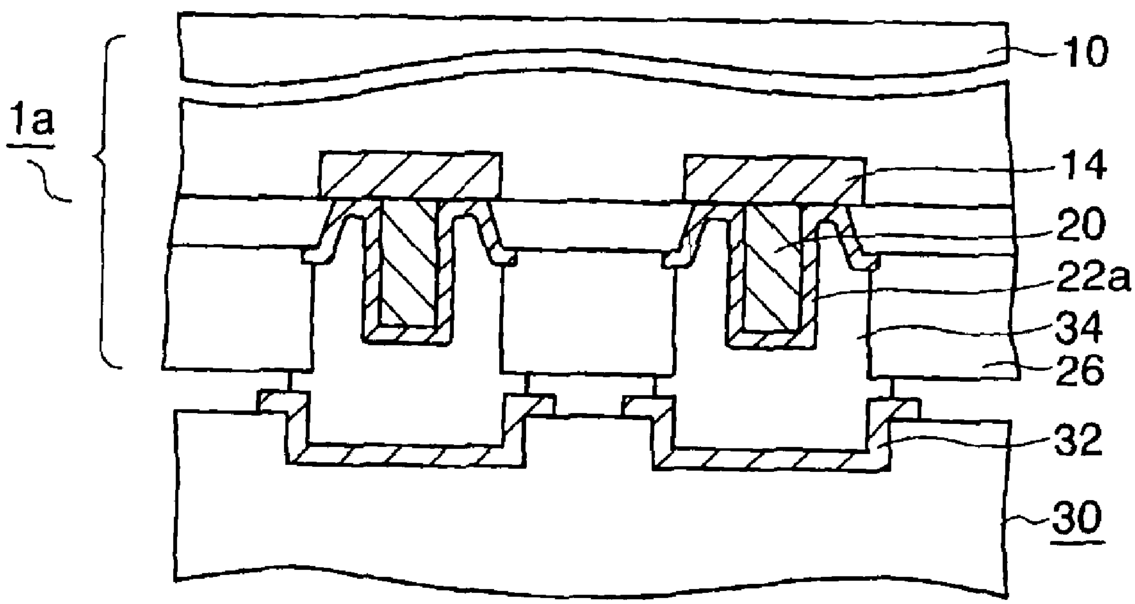
FIG. 6 is a partial sectional view showing the state that the semiconductor device according to the first embodiment is mounted on a wiring substrate.

FIGS. 4A to 4L are partial sectional views showing a semiconductor device manufacturing method according to a first embodiment of the present invention. FIG. 5A is a plan view showing a semiconductor wafer having the CSP structure according to the first embodiment, and FIG. 5B is a perspective view showing a semiconductor chip having the CSP structure according to the first embodiment. FIG. 6 is a sectional view showing the state that the semiconductor device according to the first embodiment is mounted on a wiring substrate.

Figure 1A:
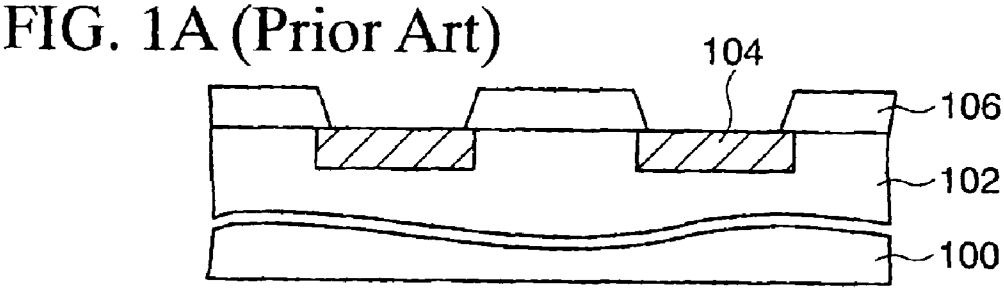
FIGS. 1A to 1H are sectional views showing a bump forming method in the wafer-level CSP according to the related art 1.
Figure 1B:
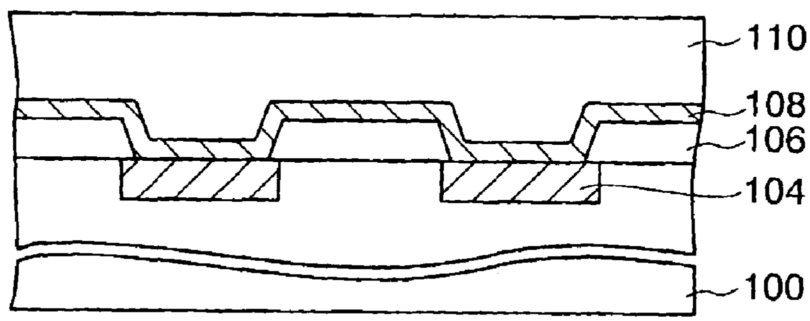
Figure 1C:
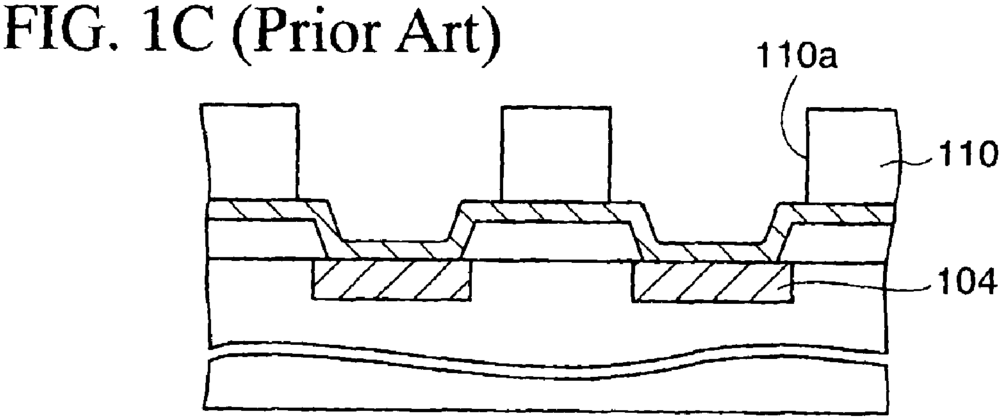
Figure 1D:
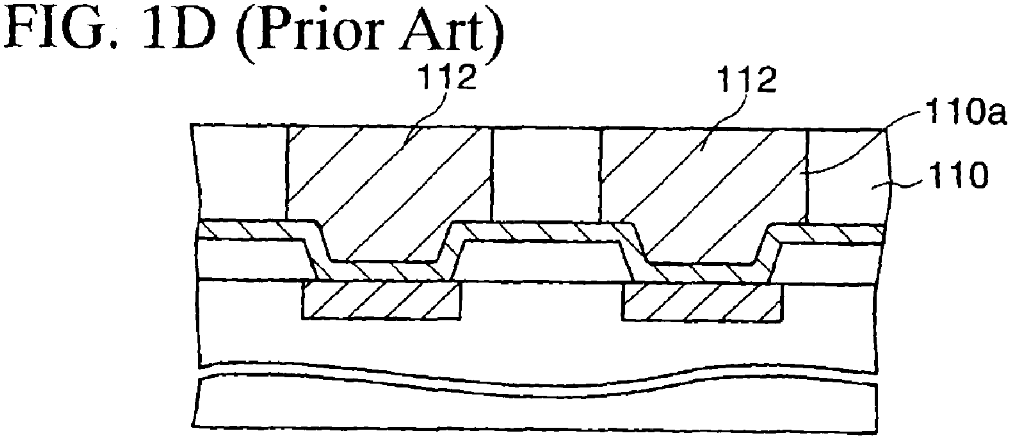
Figure 1E:
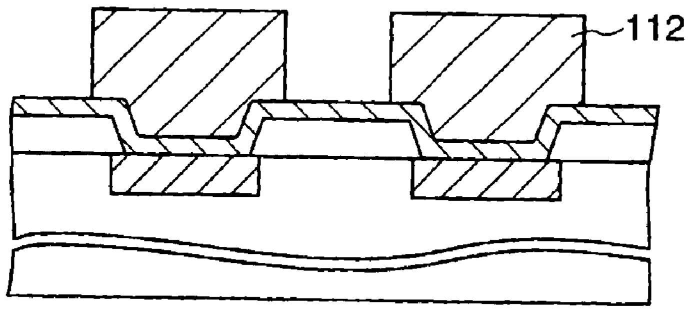
Figure 1F:
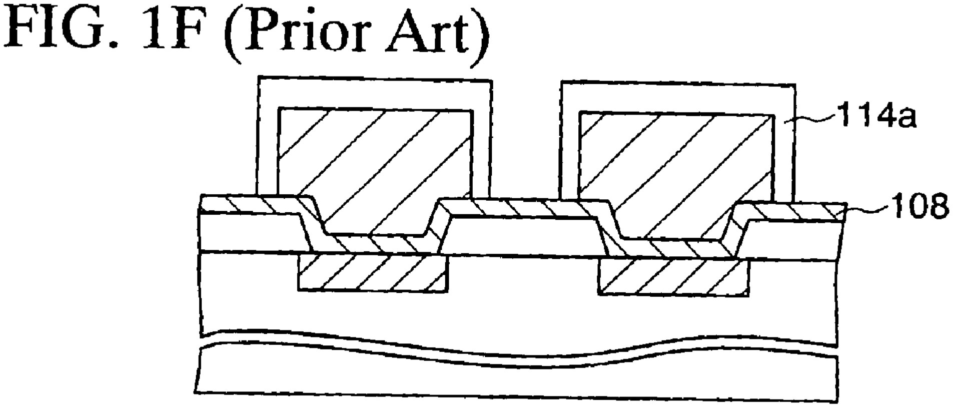
Figure 1G:
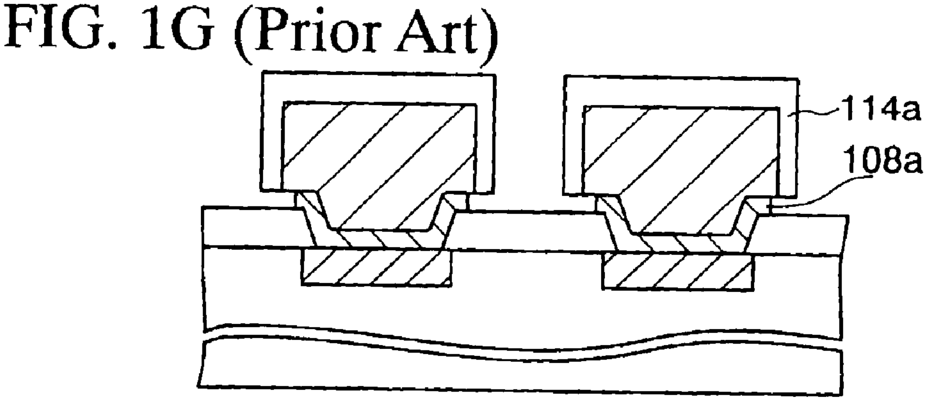
Figure 1H:
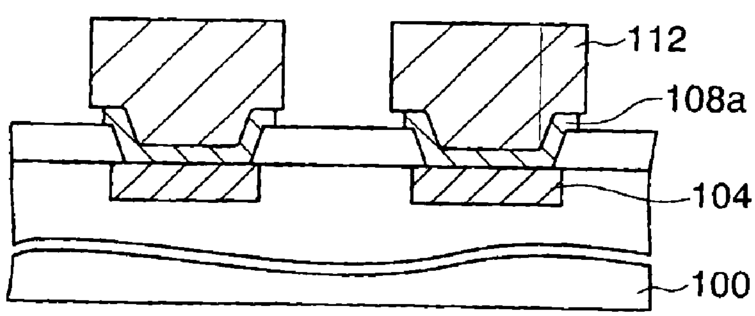
Figure 2A:
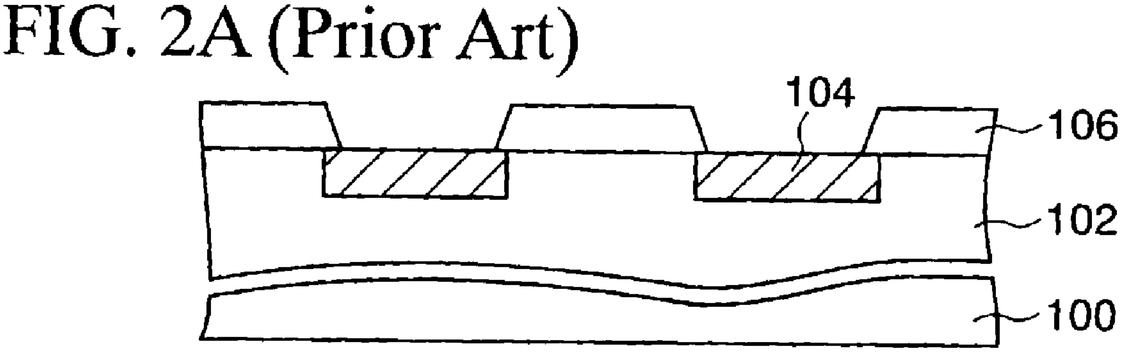
FIGS. 2A and 2B are sectional views showing a bump forming method in the wafer-level CSP according to the related art 2.
Figure 2B:
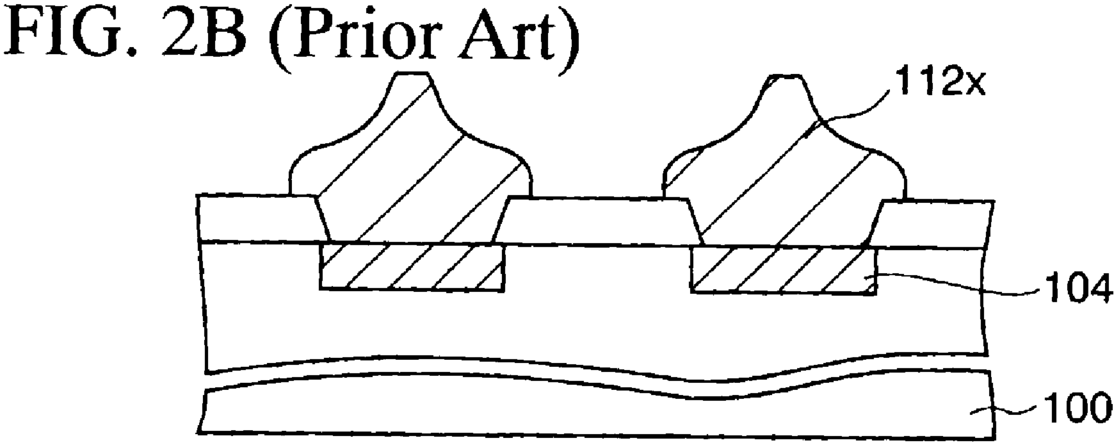
Figure 3A:
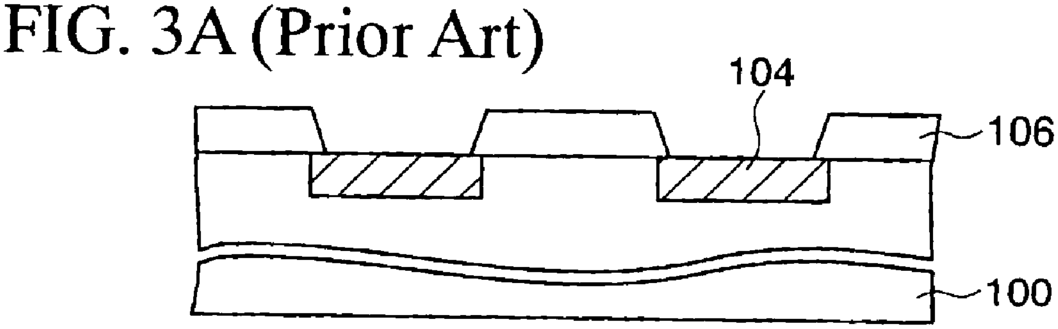
FIGS. 3A to 3H are sectional views showing a bump forming method in the wafer-level CSP according to the related art 3.
Figure 3B:
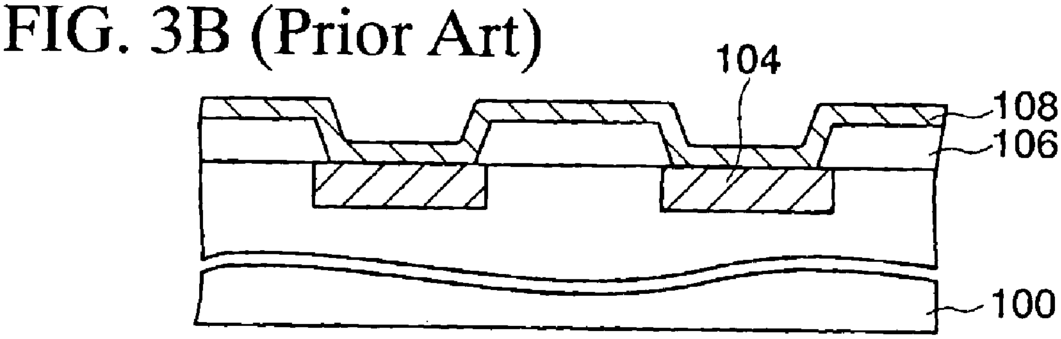
Figure 3C:
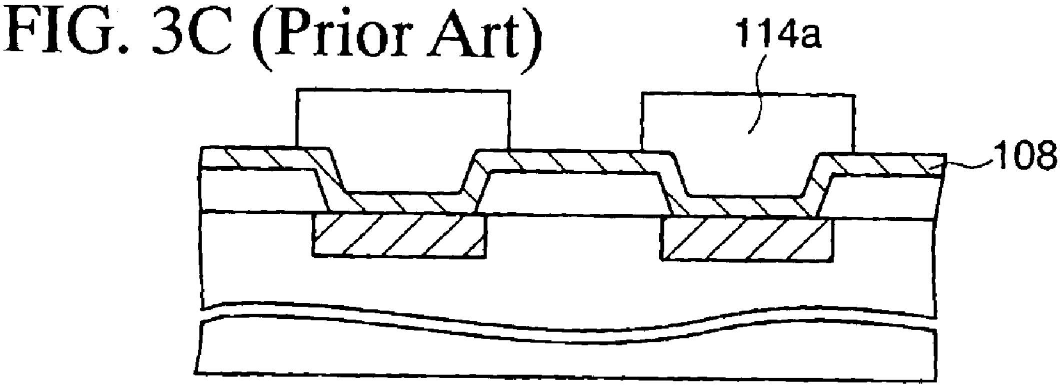
Figure 3D:
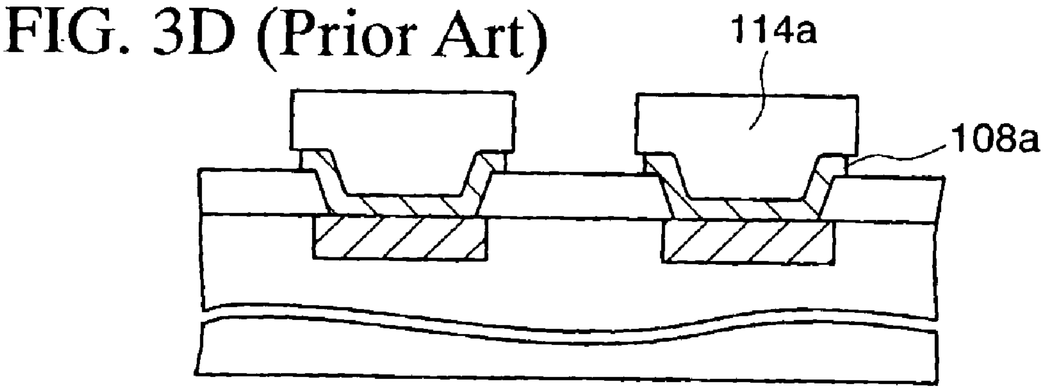
Figure 3E:
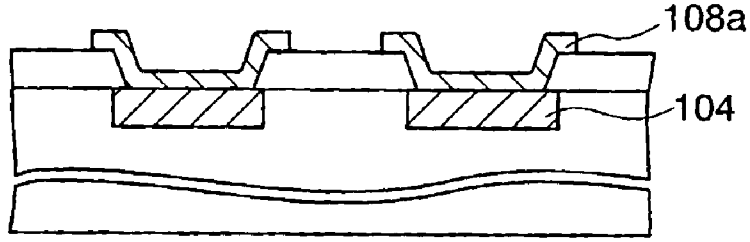
Figure 3F:
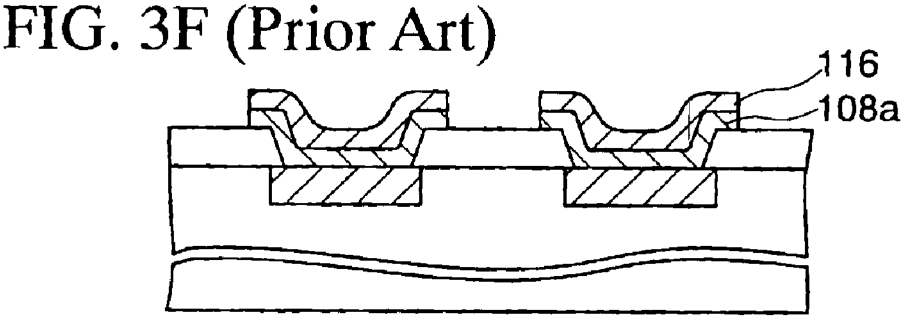
Figure 3G:
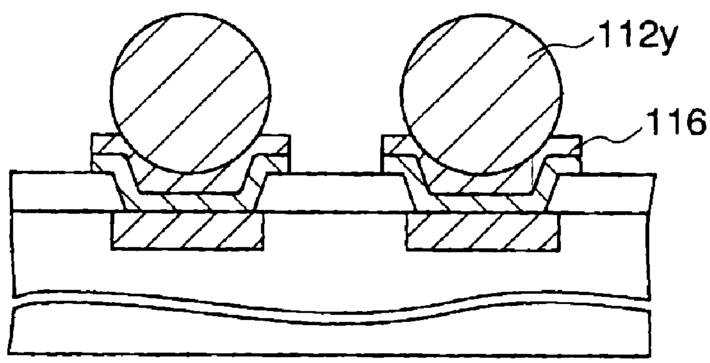
Figure 3H:
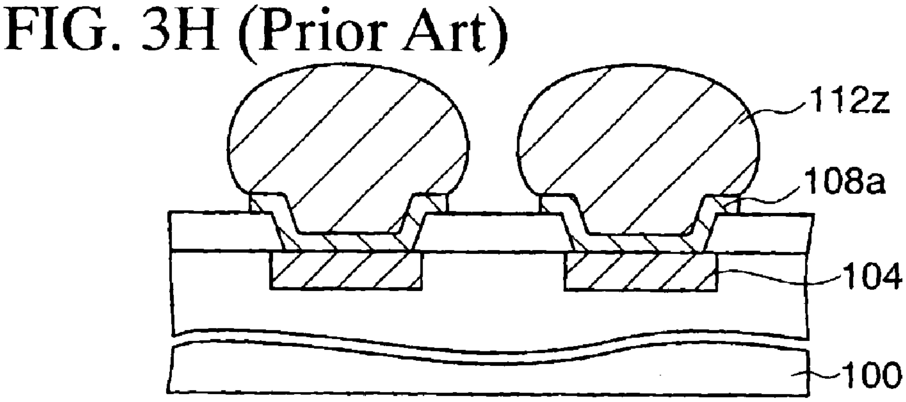
Figure 4A:
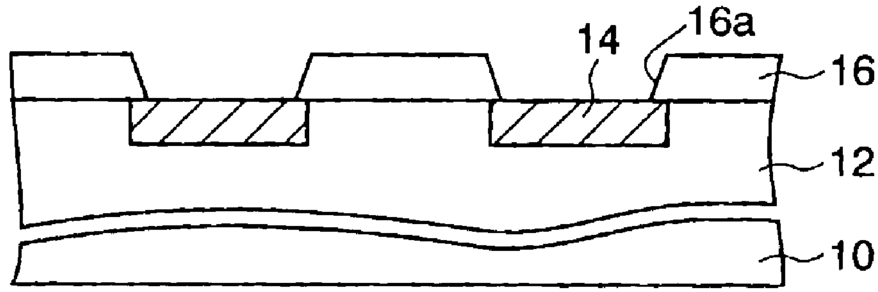

In FIG. 4A, predetermined elements and multi-layered wirings (not shown) are formed on a semiconductor substrate 10. Also, an interlayer insulating film 12 of the multi-layered wiring, a plurality of copper (Cu) electrode pads 14 buried in this film, and a passivation film (protection insulating film) 16 having opening portions 16*a,* from which the Cu electrode pads 14 are exposed, are shown.

These Cu electrode pads 14 are of the area-array type and are arranged in plural on the overall surface of the chip area over the semiconductor substrate 10. Also, the passivation film 16 is made of a silicon nitride (SiN) film whose film thickness is about 15 μm, for example.

Figure 4B:
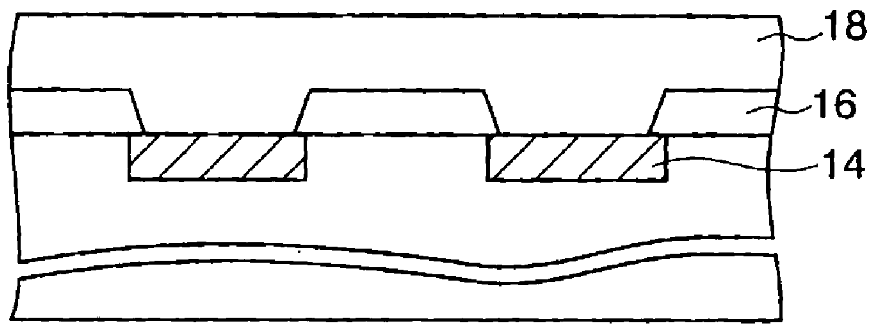

In the semiconductor device manufacturing method according to the first embodiment of the present invention, first the semiconductor substrate 10 having such a structure that the Cu electrode pads 14 are exposed from the opening portions 16*a* in the passivation film 16 shown in FIG. 4A is prepared. Then, as shown in FIG. 4B, a first dry-film photoresist 18 whose film thickness is 25 to 200 μm, for example, is laminated on the passivation film 16 and the Cu electrode pads 14.

Figure 4C:
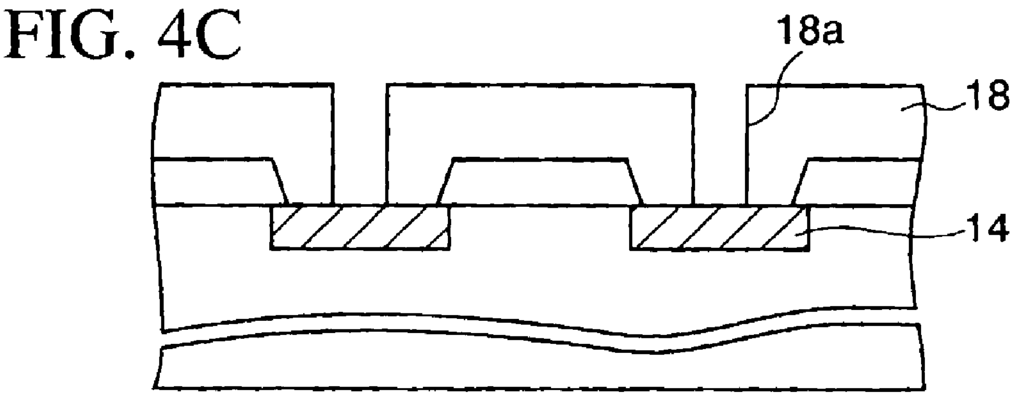

Then, as shown in FIG. 4C, opening portions 18*a* are formed in the first dry-film photoresist 18 on predetermined center portions of the Cu electrode pads 14 by exposing/developing the first dry-film photoresist 18. This opening portion 18*a* is formed to have an area that is smaller than an area of the Cu electrode pad 14.

Figure 4D:
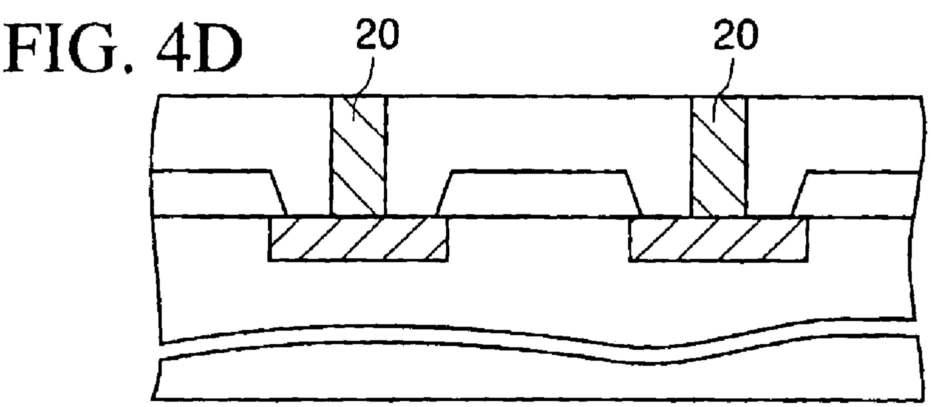

Then, as shown in FIG. 4D, a Cu film 20 is formed in the opening portions 18*a* of the first dry-film photoresist 18 by the electroless plating to bury therein (the Cu film 20 that is buried in the opening portion 18*a* is referred to as a "tail terminal 2" hereinafter).

Figure 4E:
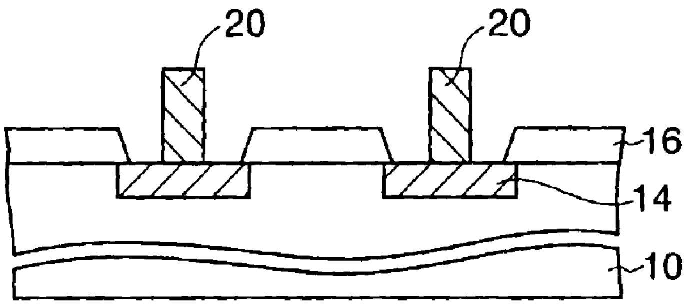
Figure 4F:
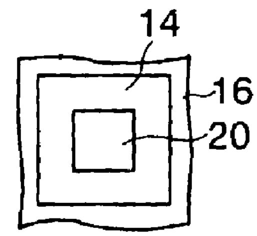

Then, as shown in FIG. 4E and FIG. 4F, the tail terminals 20 each being connected electrically to the predetermined center portion of the Cu electrode pad 14 are exposed by removing the first dry-film photoresist 18.

Since this tail terminal 20 is formed in the opening portion 18*a* of the first dry-film photoresist 18, its height is formed at about 25 to 200 μm. Also, it is preferable that the tail terminal 20 should be formed in the center portion of the Cu electrode pad 14 such that its diameter is set to ⅓ to ⅔, about ½ as the optimum value, of a diameter of the Cu electrode pad 14.

In this case, the tail terminal 20 may be formed in any manner if its area is smaller than an area of the Cu electrode pad 14. Also, such tail terminal 20 may be formed at a position that is displaced from the center portion of the Cu electrode pad 14.

Also, it is preferable that a height of the tail terminal 20 should be set higher. But such height can be adjusted appropriately with regard to the area of the Cu electrode pad 14, the area of the tail terminal 20, characteristics of the electronic parts into which the semiconductor device is packaged, etc.

For example, if a size of the Cu electrode pad 14 is about 60 μm□, preferably the tail terminal 20 should be formed to have a size of about 30 μm□ and a height of about 50 μm□.

Figure 4G:
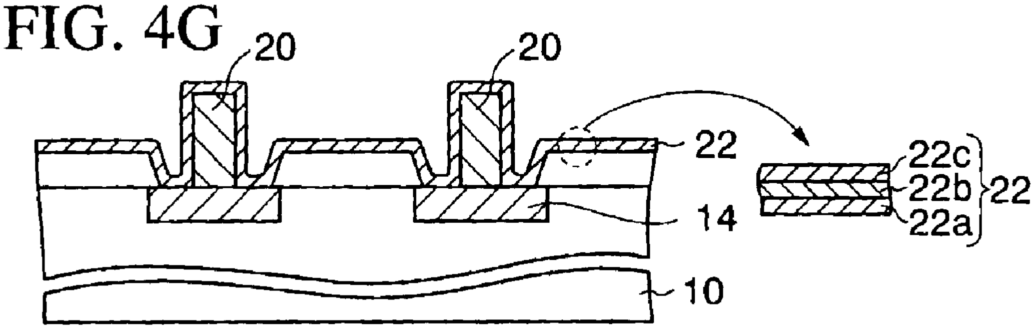

Then, as shown in FIG. 4G, a nickel (Ni) film 22*a* of 1 μm film thickness, a platinum (Pt) film 22*b* of 1 μm film thickness, and a gold (Au) film 22*c* of 1 μm film thickness, for example, are formed in sequence from the bottom on the Cu electrode pads 14, the tail terminals 20, and the passivation film 16 by the sputter method. Thus, a barrier conductive film 22 is formed.

The barrier conductive film 22 is not limited to the above laminated film. A metal film made of a metal selected from nickel (Ni), platinum (Pt), gold (Au), chromium (Cr), titanium (Ti), tungsten (W), palladium (Pd), and the like, or a laminated film made of them may be employed.

Figure 4H:
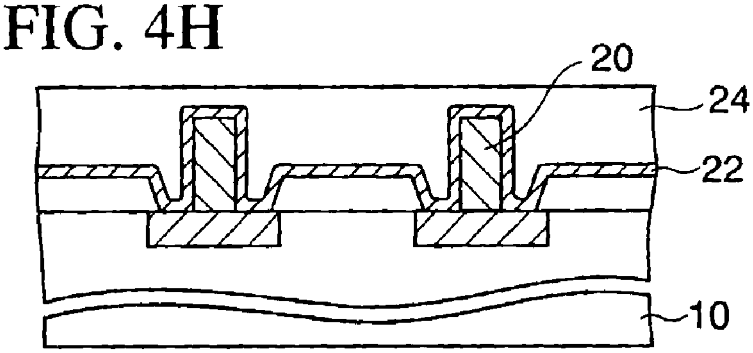
Figure 4I:
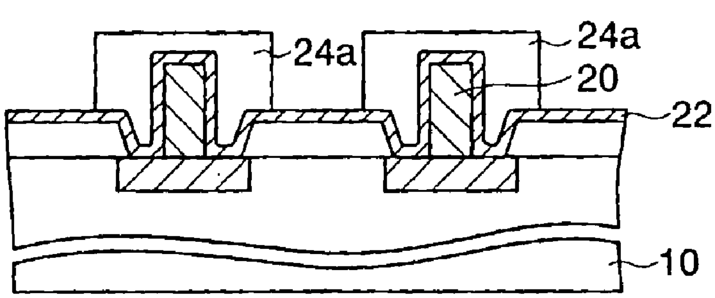

Then, as shown in FIG. 4H, a second dry-film photoresist 24 is laminated on the barrier conductive film 22. Then, as shown in FIG. 4I, resist masks 24*a* for covering the tail terminal 20 portions and their neighboring areas are formed selectively on the barrier conductive film 22 by exposing/developing the second dry-film photoresist 24.

Figure 4J:
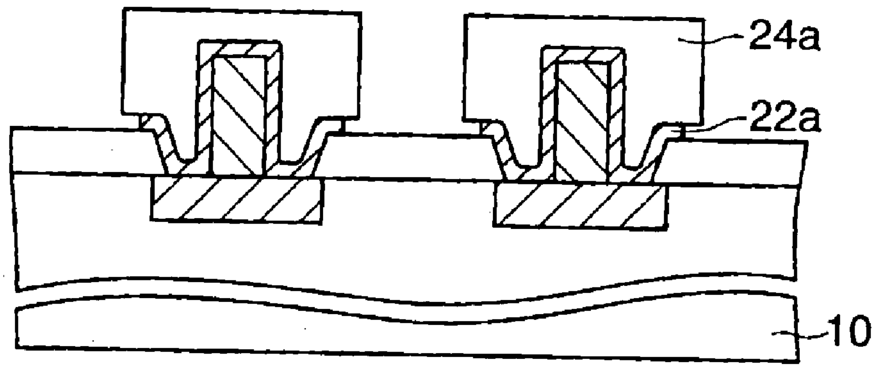
Figure 4K:
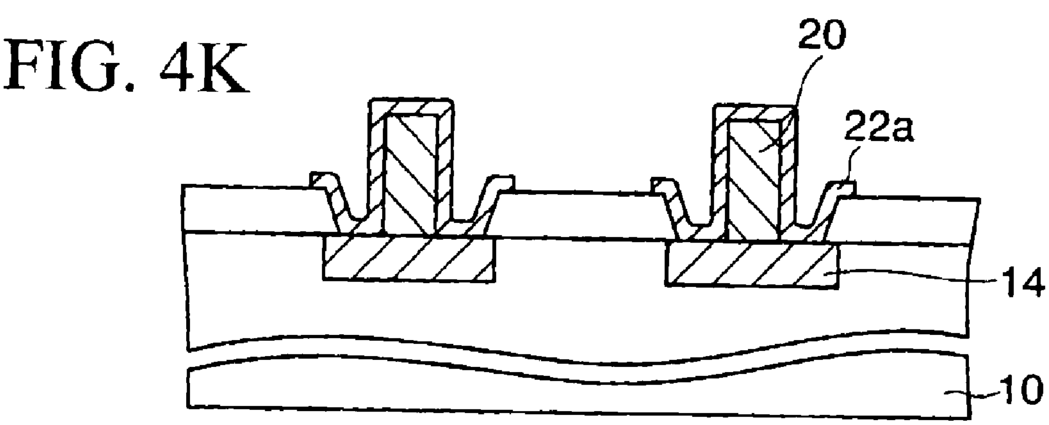

Then, as shown in FIG. 4J and FIG. 4K, the barrier conductive film 22 is wet-etched by using the resist masks 24*a* as a mask. Then, barrier film patterns 22*a* for covering the Cu electrode pads 14 and the tail terminals 20 are formed by removing the resist masks 24*a*.

Figure 4L:
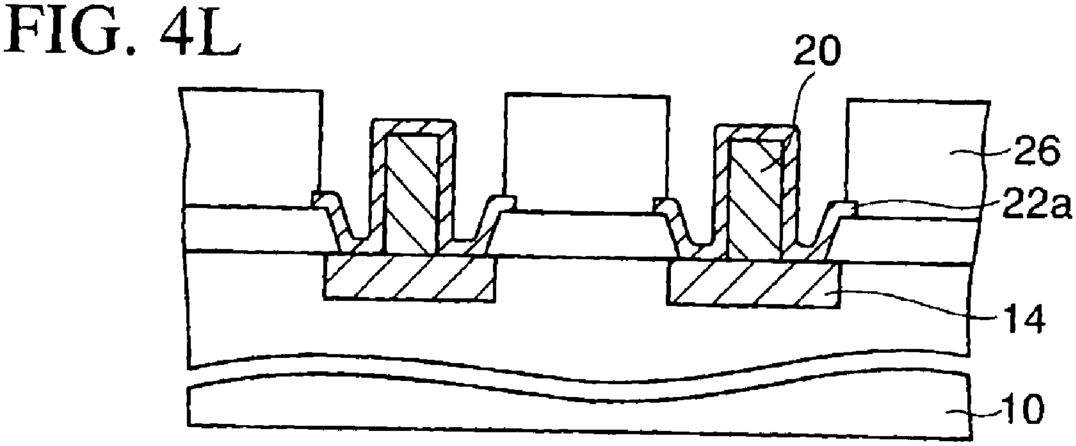

Then, as shown in FIG. 4L, a resin layer 26 is formed such that the tail terminals 20 and main portions of the barrier film patterns 22*a* are exposed. In this case, such a manner that the resin layer 26 is omitted may be employed.

As shown in FIG. 5A, a semiconductor wafer 1 to which film formation, processing, etc. of the CSP structure are applied in the wafer state is obtained at a time when this step is ended. Then, as shown in FIG. 5B, a semiconductor chip 1*a* having the wafer-level CSP structure is obtained by dicing the semiconductor wafer 1. In this case, in FIG. 5A and FIG. 5B, detailed structures such as the tail terminals 20, etc. are not depicted, and the semiconductor wafer 1 and the semiconductor chip 1*a* having the wafer-level CSP structure are schematically depicted.

According to the above, the semiconductor device having the wafer-level CSP structure according to the first embodiment of the present invention is completed. In this case, as the semiconductor device according to the first embodiment of the present invention, the semiconductor wafer 1 having the CSP structure may also be used, or the semiconductor chip 1*a* having the CSP structure, which is obtained by separating the semiconductor wafer 1 into individual pieces by means of the dicing, may also be used.

Next, a method of mounting the semiconductor chip 1*a* with this CSP structure on the wiring substrate will be explained hereunder. First, as shown in FIG. 6, a predetermined wiring substrate 30 is prepared. Connecting pads 32 each having a concave portion in its main portion are formed on an upper surface of the wiring substrate 30. Then, a solder paste is coated on the connecting pads 32 of the wiring substrate 30 by a predetermined amount by the screen printing method or the dispenser method.

Then, the semiconductor chip 1*a* is mounted on the wiring substrate 30 such that the tail terminal 20 portions of the semiconductor chip 1*a* having the above CSP structure are arranged in registration with the connecting pads 32 of the wiring substrate 30.

Then, solder layers 34 are formed by executing the reflow soldering at the temperature of about 200 to 250° C. As a result, the Cu electrode pads 14 and the tail terminals 20 of the semiconductor chip 1*a* are connected electrically to the connecting pads 32 of the wiring substrate 30 via the barrier film patterns 22*a* and the solder layers 34. In this case, the jointing material such as the conductive resin, or the like may be used in place of the metal brazing material such as the solder layer 34, etc.

As described above, in the semiconductor chip 1*a* having the CSP structure according to the present embodiment, the column-like tail terminals 20 whose top end area is smaller than the area of the Cu electrode pad 14 are formed on the Cu electrode pads 14 in such a manner that they are connected electrically to the Cu electrode pads 14. Then, the Cu electrode pad 14 and the tail terminal 20 are covered with the barrier film pattern 22*a*. Then, preferably the resin layer 26 should be formed to expose the tail terminal 20 portions and their neighboring areas.

Since the area of the top end surface of the tail terminal 20 is reduced smaller by employing such structure, an amount of solder paste that is coated on the connecting pads 32 of the wiring substrate 30 can be reduced smaller rather than the related art. In addition, since the solder layers 34 are formed such that the solder paste is filled into spaces between side surfaces of the tail terminal 20 portions and the resin layer 26, not only the top end surface of the tail terminal 20 but also the overall side surfaces thereof can act as the jointing portion.

Therefore, although the column-like tail terminal 20 portion that is narrower than the related art is employed as the connecting electrode and also a coated amount of the solder paste is reduced, the large jointing area can be assured between the tail terminal 20 and the connecting pad 32 of the wiring substrate 30 via the solder layer 34. As a result, the reliability of the jointing to the wiring substrate 30 can be improved.

Also, since a film thickness of the solder layer 34 that is interposed between the semiconductor chip 1*a* and the wiring substrate 30 can be reduced, a thickness of the electronic parts in which the semiconductor chip 1*a* is mounted on the wiring substrate 30 can also be reduced. In addition, since the structure in which the solder layer 34, the barrier film pattern 22*a*, and the tail terminal 20 seldom protrude from the Cu electrode pad 14 area to the outside can be obtained, generation of the electric short-circuit between the Cu electrode pads 14 can be prevented even if the pitch between the Cu electrode pads 14 is narrowed. Thus, the method of the first embodiment of the present invention can easily deal with the case that the pitch between the electrode pads 14 should be narrowed.

Also, the Cu electrode pad 14 and the tail terminal 20 are covered with the barrier film pattern 22*a*. Therefore, mutual diffusion between materials of the solder layer 34, the tail terminal 20, and the Cu electrode pad 14 can be prevented, and thus reliability of the semiconductor device can be improved.

In this case, in case the resin layer 26 is omitted, protrusion of the solder paste in the lateral direction can be prevented to some extent by the surface tension of the solder that are melted when the reflow soldering is executed. However, from such a viewpoint that the Cu electrode pads are caused to deal with the narrower pitch by suppressing further the protrusion of the solder layer 34 from the Cu electrode pad 14 area to the outside, it is preferable that the resin layer 26 should be provided.

(Second Embodiment)

FIGS. 7A to 7L are partial sectional views showing a semiconductor device manufacturing method according to a second embodiment of the present invention. FIG. 8 is a partial sectional view showing the state that the semiconductor device according to the second embodiment is mounted on the wiring substrate. A different point of the second embodiment from the first embodiment is that the tail terminals are formed after the opening portions in the passivation film are buried by the Cu film. In other words, the second embodiment shows such a manner that an amount of the jointing material used when the semiconductor chip is mounted on the wiring substrate can be further reduced by eliminating a level difference of the opening portions in the passivation film. The detailed explanation of the same steps as those in the first embodiment will be omitted herein.

Figure 7A:
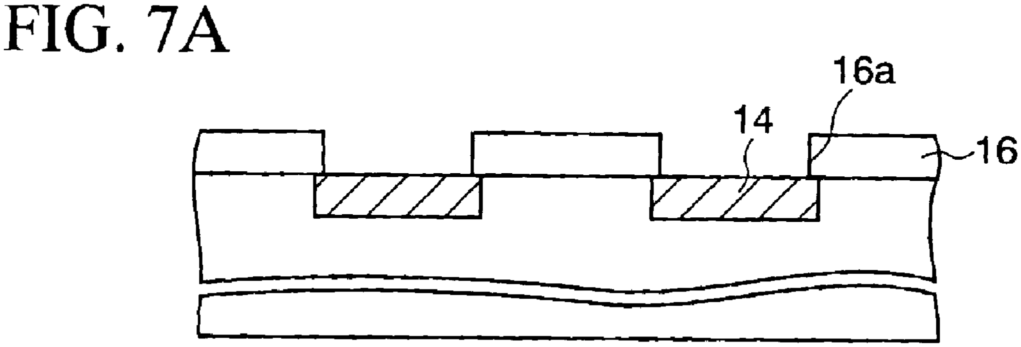
FIGS. 7A to 7L are partial sectional views showing sequentially a semiconductor device manufacturing method according to a second embodiment of the present invention.
Figure 8:
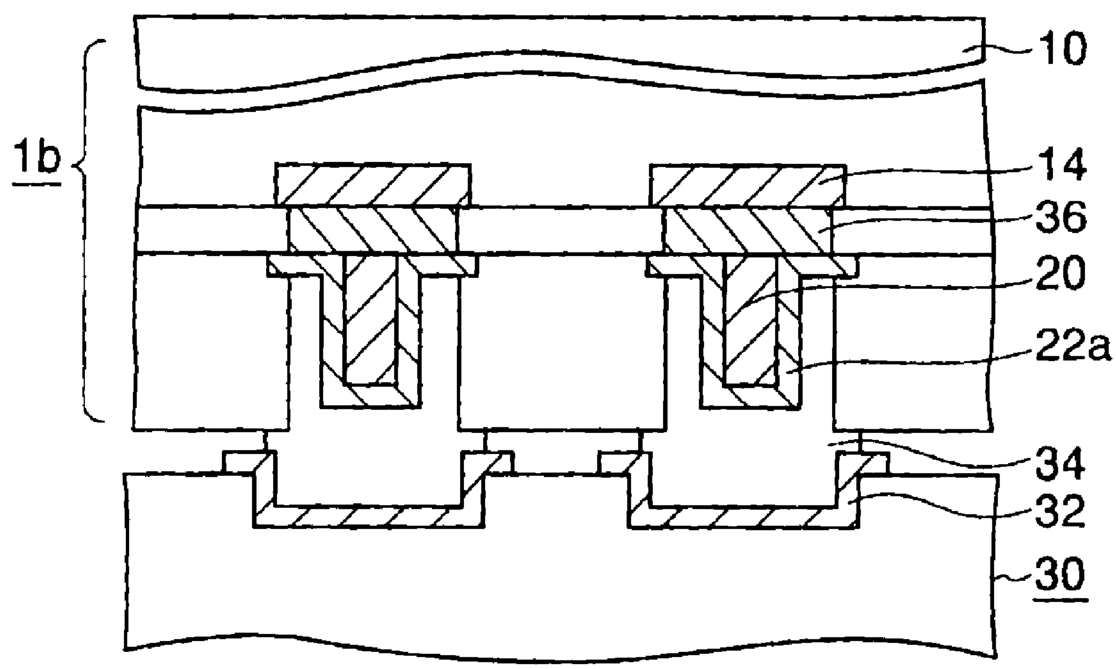
FIG. 8 is a partial sectional view showing the state that the semiconductor device according to the second embodiment is mounted on the wiring substrate.

In the semiconductor device manufacturing method according to the second embodiment, like FIG. 4A in the first embodiment, as shown in FIG. 7A, first the semiconductor substrate 10 having such a structure that the Cu electrode pads 14 are exposed from the opening portions 16*a* in the passivation film 16 is prepared.

Figure 7B:
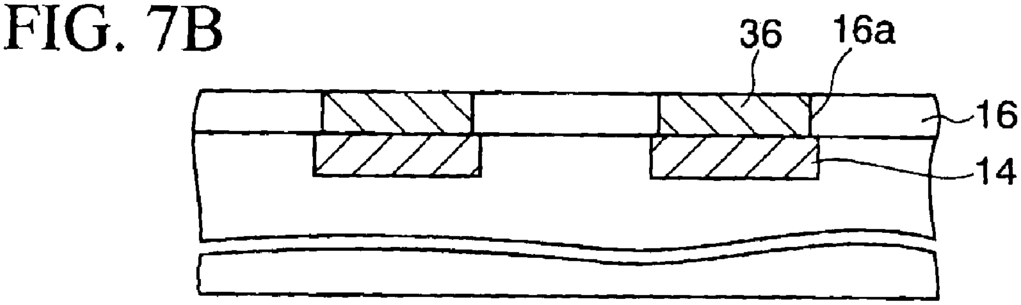

Then, as shown in FIG. 7B, Cu cap films (cap conductive films) 36 are grown selectively on the Cu electrode pads 14 by the electroless plating to bury the opening portions 16*a* in the passivation film 16. Then, upper surfaces of the Cu cap films 36 are planarized.

Figure 7C:
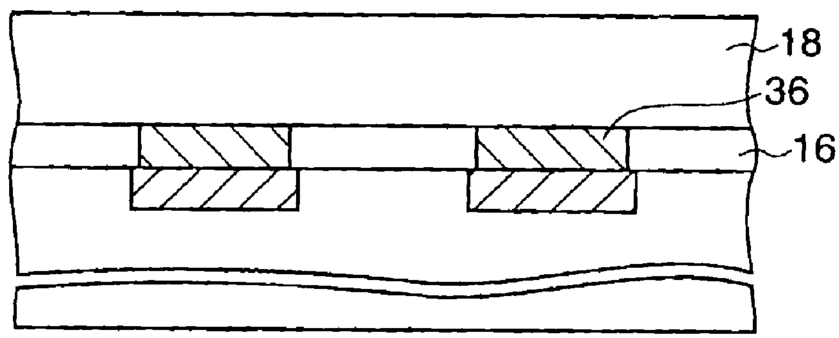
Figure 7D:
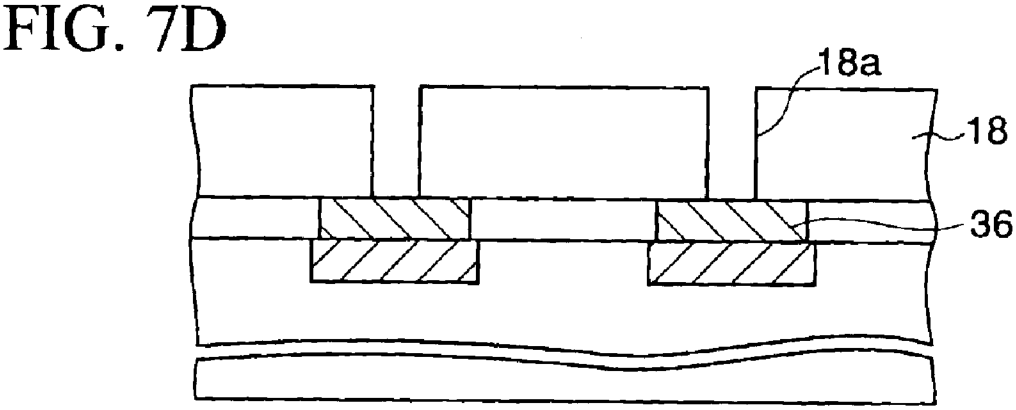

Then, as shown in FIG. 7C, the first dry-film photoresist 18 is laminated on the Cu cap films 36 and the passivation film 16. Then, as shown in FIG. 7D, the opening portions 18*a* from which a part of the Cu cap film 36 is exposed are formed by exposing/developing the first dry-film photoresist 18. A thickness of the first dry-film photoresist 18 and a size of the opening portion 18*a* may be formed similarly to the first embodiment.

Figure 7E:
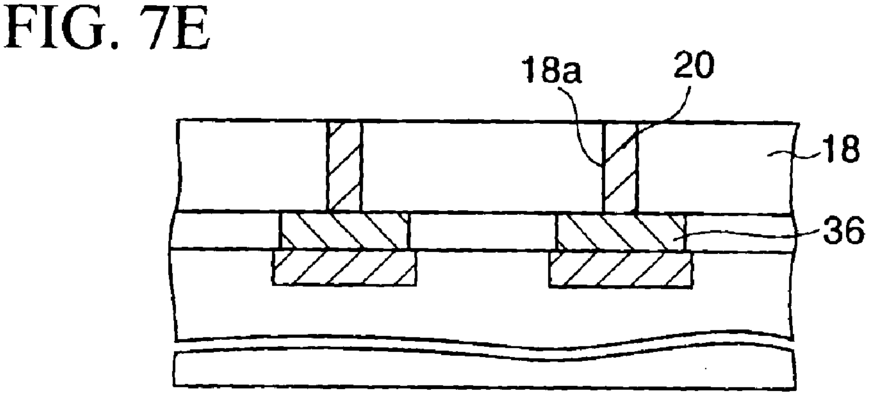
Figure 7F:
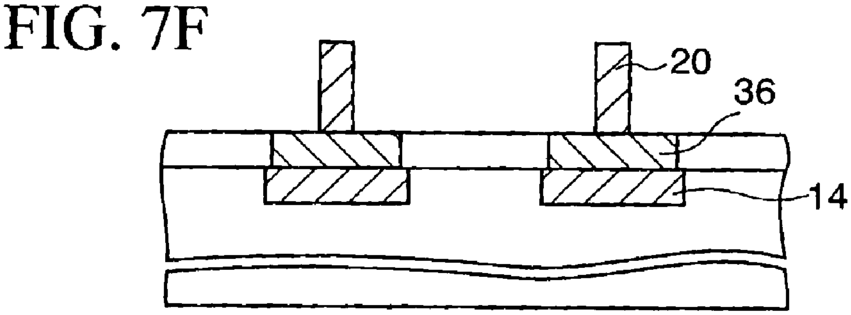

Then, as shown in FIG. 7E, according to the similar method to the first embodiment, the tail terminals 20 made of the Cu film are formed in the opening portions 18*a* in the first dry-film photoresist 18 by the electroless plating. Then, as shown in FIG. 7F, the tail terminals 20 that are connected electrically to the Cu electrode pads 14 via the Cu cap film 36 are obtained by removing the first dry-film photoresist 18.

Figure 7G:
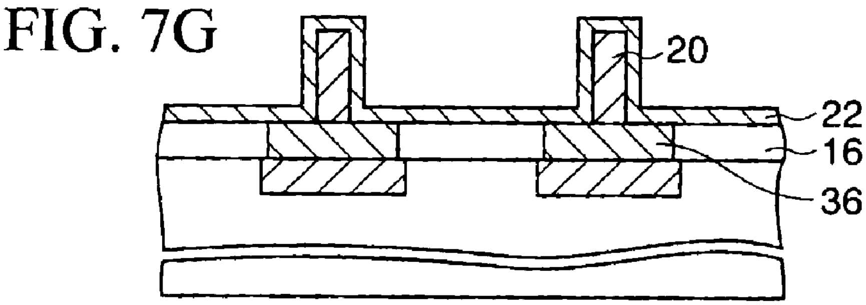

Then, as shown in FIG. 7G, according to the similar method to the first embodiment, the barrier conductive film 22 is formed on the passivation film 16, the Cu cap films 36, and the tail terminals 20 by the sputter method.

Figure 7H:
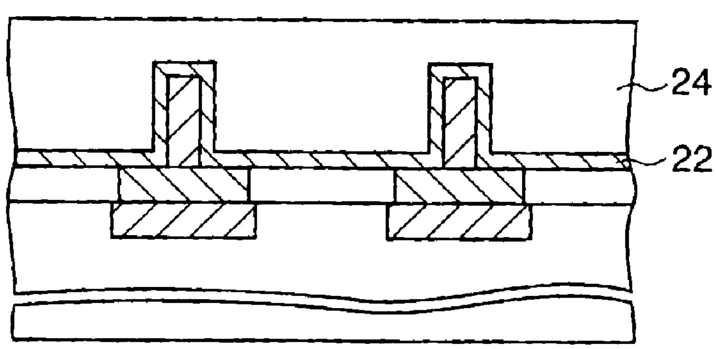
Figure 7I:
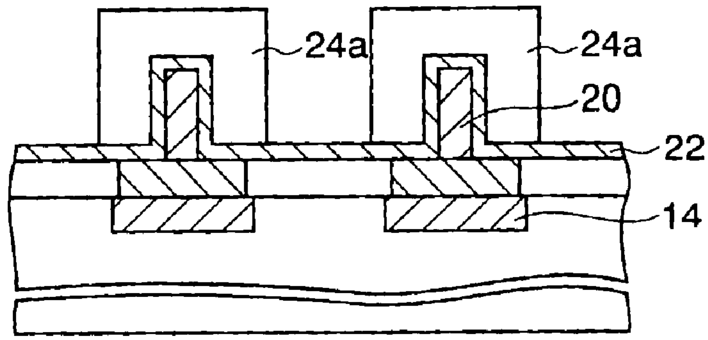

Then, as shown in FIG. 7H and FIG. 7I, according to the similar method to the first embodiment, the second dry-film photoresist 24 is laminated on the barrier conductive film 22. Then, the resist masks 24*a* for covering the tail terminal 20 portions and their neighboring areas are formed selectively on the barrier conductive film 22 by exposing/developing the second dry-film photoresist 24.

Figure 7J:
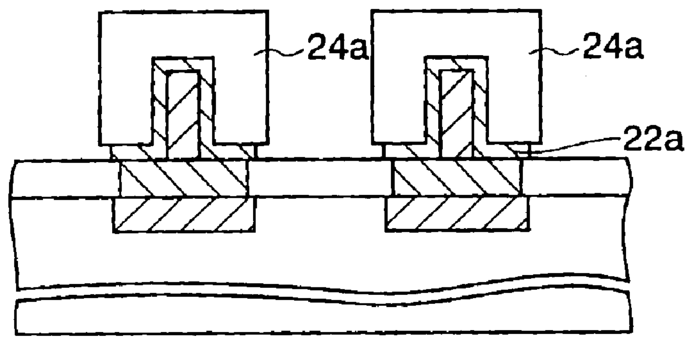
Figure 7K:
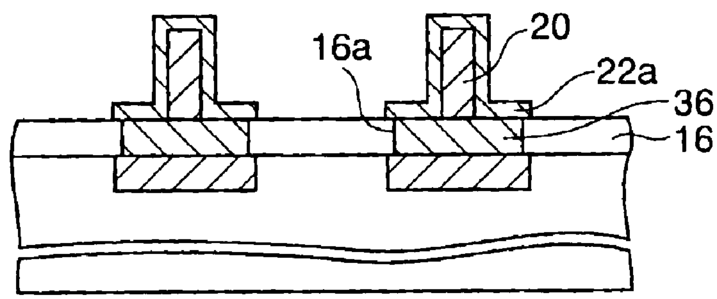

Then, as shown in FIG. 7J and FIG. 7K, according to the similar method to the first embodiment, the barrier conductive film 22 is wet-etched by using the resist masks 24*a* as a mask. Then, the barrier film patterns 22*a* for covering the tail terminals 20 and the Cu cap films 36 are formed by removing the resist masks 24*a*. At this time, since the opening portion 16*a* in the passivation film 16 is buried by the Cu cap film 36 to planarize, the concave portion is not formed around the root portion of the tail terminal 20, unlike the first embodiment.

Figure 7L:
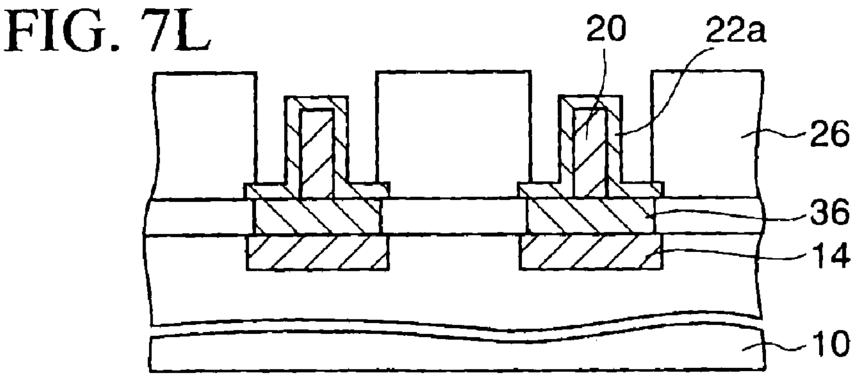

Then, as shown in FIG. 7L, the resin layer 26 is formed such that main portions of the barrier film patterns 22*a* for covering the tail terminals 20 are exposed. In this case, such a manner may be employed that the resin layer 26 is omitted.

Then, like the first embodiment, the semiconductor substrate 10 is subjected to the dicing, and thus individual semiconductor chips each having the CSP structure are obtained.

Then, as shown in FIG. 8, according to the similar method to the first embodiment, the tail terminal 20 portions of the semiconductor chip 1*b* are mounted on the wiring substrate 30 such that they are connected electrically to the connecting pads 32 via the solder layers 34.

According to the semiconductor chip 1*b* of the second embodiment, the concave portion due to the opening portion 16*a* of the passivation film 16 is not formed around the root portion of the tail terminal 20. Therefore, in addition to the similar advantages to the first embodiment, a coated amount of the solder paste can be reduced rather than the first embodiment, and thus a thickness of the electronic parts can be further reduced. In particular, if the passivation film 16 is formed as a thick film, a coated amount of the solder paste can be reduced remarkably.

(Third Embodiment)

FIGS. 9A to 9J are partial sectional views showing a semiconductor device manufacturing method according to a third embodiment of the present invention. FIG. 10 is a partial sectional view showing the state that the semiconductor device according to the third embodiment is mounted on the wiring substrate.

The third embodiment shows such a manner that the Al-series electrode pad made of aluminum (Al) or Al alloy such as Al—Cu, or the like is used as the electrode pad of the semiconductor device.

Figure 9A:
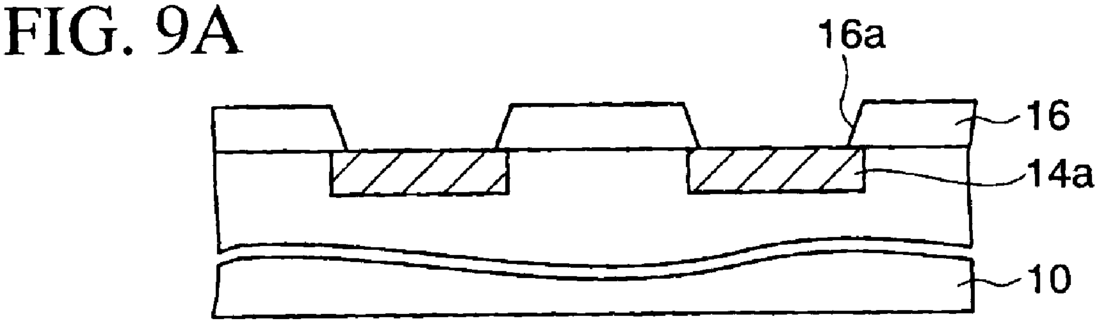
FIGS. 9A to 9J are partial sectional views showing sequentially a semiconductor device manufacturing method according to a third embodiment of the present invention.
Figure 10:
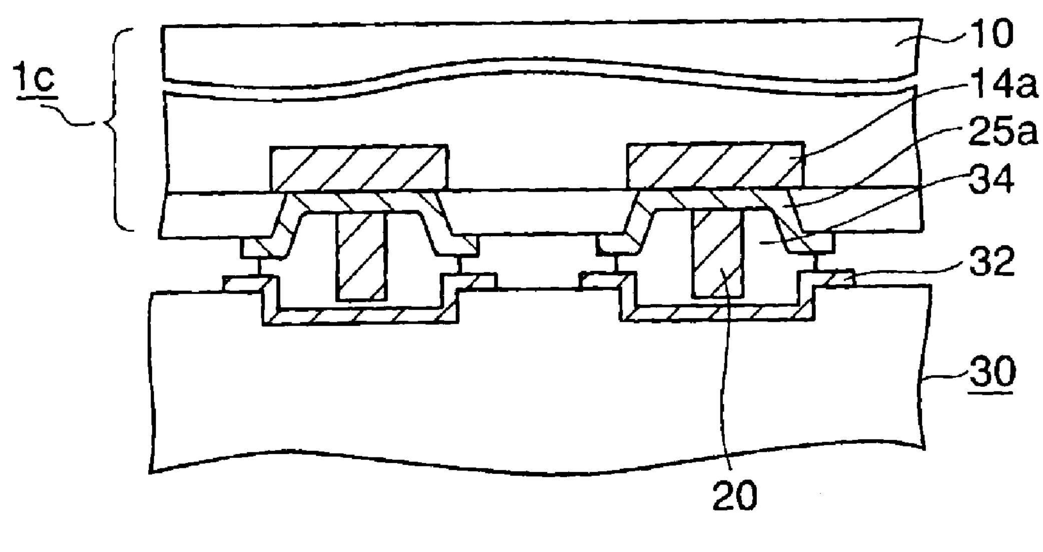
FIG. 10 is a partial sectional view showing the state that the semiconductor device according to the third embodiment is mounted on the wiring substrate.

In the semiconductor device manufacturing method according to the third embodiment, as shown in FIG. 9A, first the semiconductor substrate 10 having a structure in which Al-series electrode pads 14*a* are exposed from the opening portions 16*a* of the passivation film 16 is prepared.

Figure 9B:
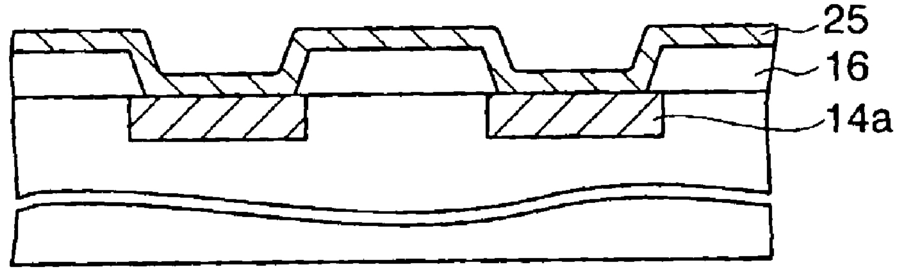

Then, as shown in FIG. 9B, a barrier conductive film 25 made of gold (Au), or the like and having a film thickness of about 1 $\mu$m is formed on the Al-series electrode pads 14*a* and the passivation film 16 by the sputter method. It is preferable that the gold (Au) should be used as the barrier conductive film 25. In this case, a metal film made of a metal selected from nickel (Ni), platinum (Pt), gold (Au), chromium (Cr), titanium (Ti), tungsten (W), palladium (Pd), etc. or a laminated film made of them may be employed.

Figure 9C:
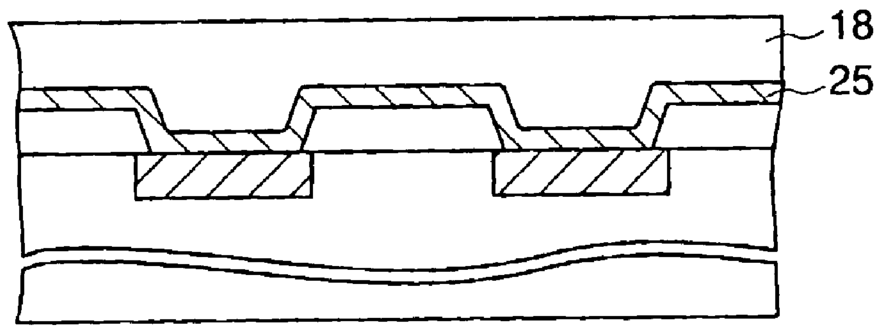
Figure 9D:
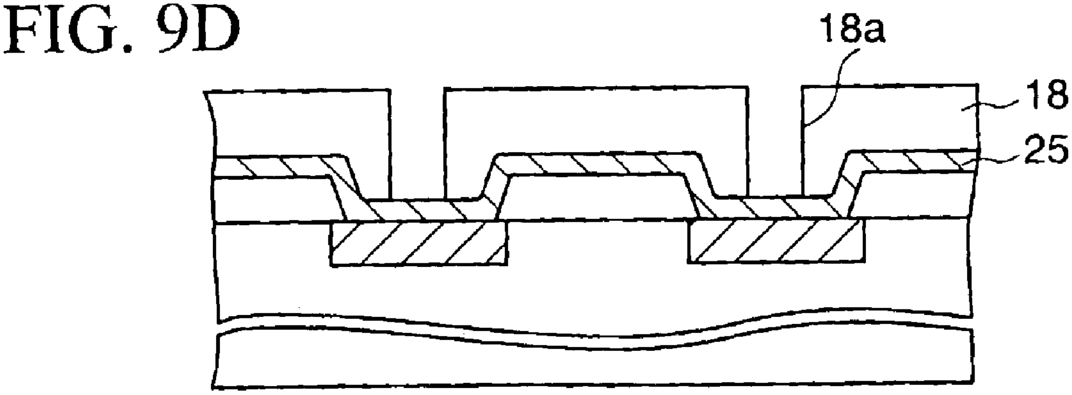

Then, as shown in FIG. 9C and FIG. 9D, the first dry-film photoresist 18 whose film thickness is about 25 to 200 $\mu$m is laminated on the barrier conductive film 25, and then is exposed/developed. Thus, the opening portions 18*a* each having an area that is smaller than an area of the Al-series electrode pad 14*a* are formed on the barrier conductive film 25 over the center portions of the Al-series electrode pads 14*a* respectively. A size and a height of this opening portion 18*a* are formed similarly to the opening portion 18*a* in the first dry-film photoresist 18 in the first embodiment.

Figure 9E:
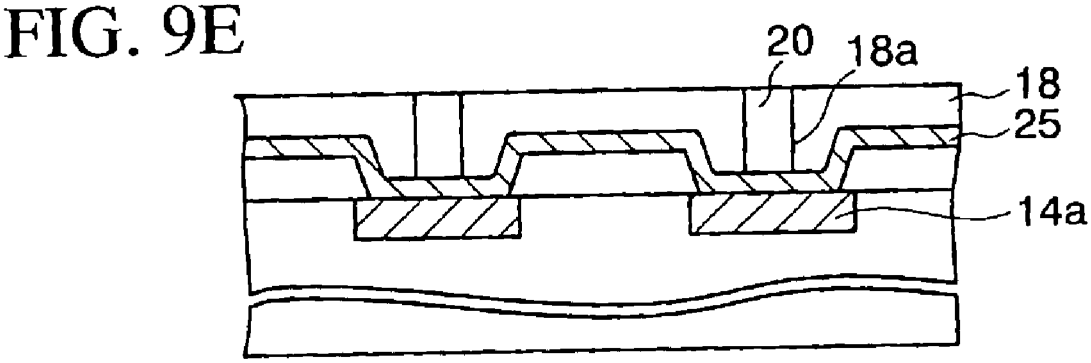
Figure 9F:
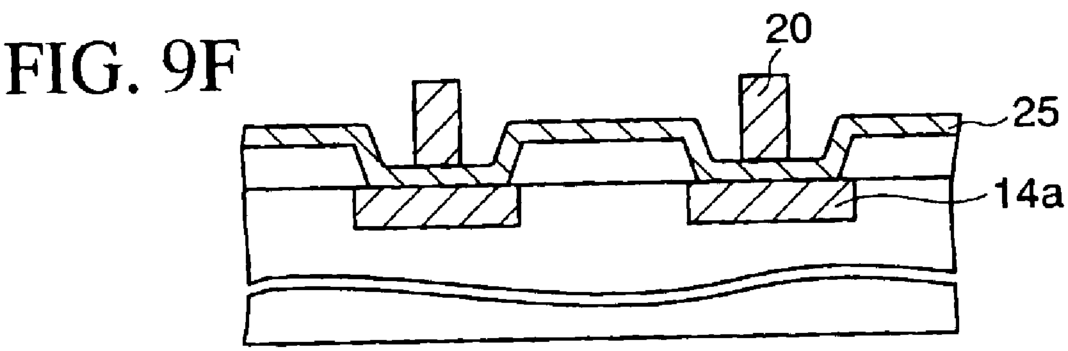

Then, as shown in FIG. 9E and FIG. 9F, a metal film is formed in the opening portions 18*a* of the first dry-film photoresist 18 by the electroless plating. Then, the tail terminals 20 are formed by removing the first dry-film photoresist 18. The tail terminals 20 are formed of a metal film mead of a metal selected from a group consisting of gold (Au), platinum (Pt), nickel (Ni), copper (Cu), etc., or a laminated film made of plural metals. A size and a height of this tail terminal 20 are formed similarly to the first embodiment.

Figure 9G:
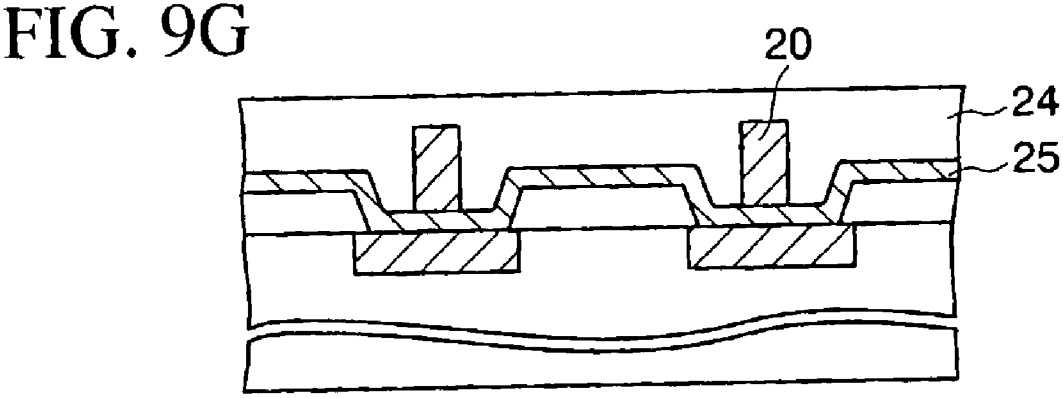
Figure 9H:
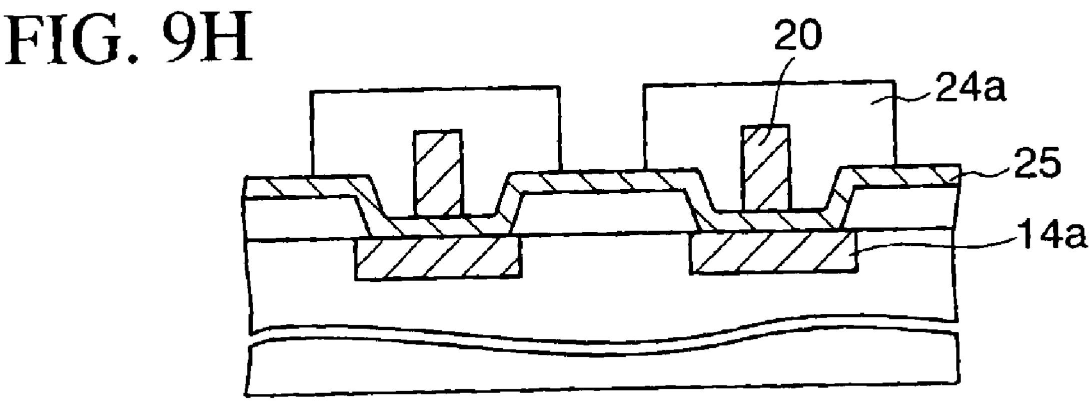

Then, as shown in FIG. 9G and FIG. 9H, the second dry-film photoresist 24 is laminated on the tail terminals 20 and the barrier conductive film 25. Then, the resist masks 24*a* for covering the tail terminal 20 portions and their neighboring areas are formed selectively on the barrier conductive film 25 by exposing/developing the second dry-film photoresist 24.

Figure 9I:
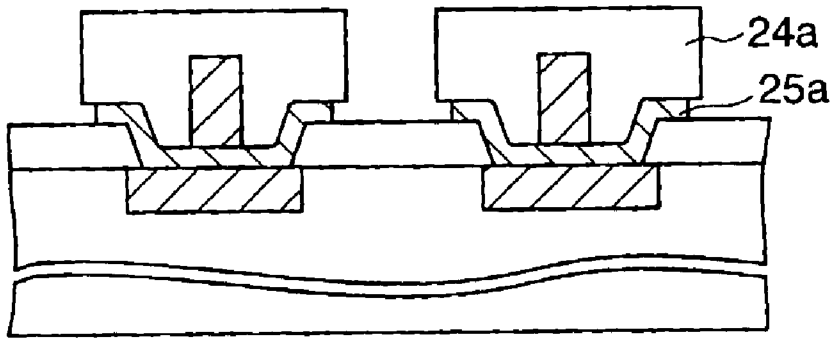
Figure 9J:
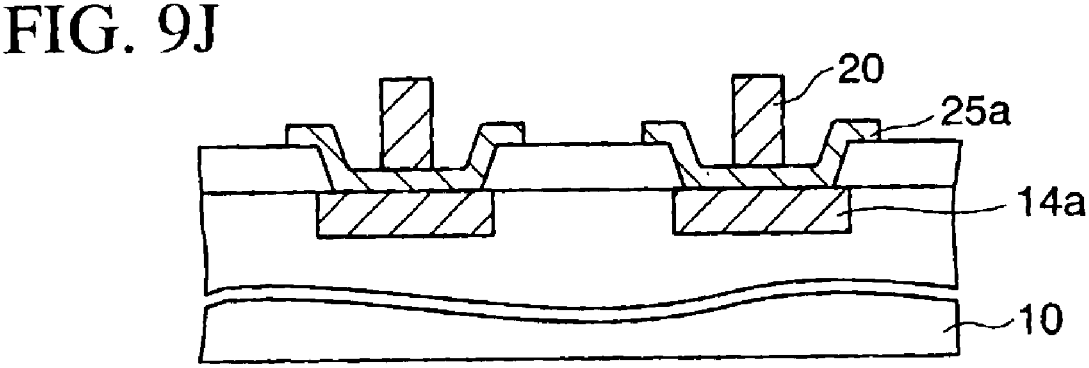

Then, as shown in FIG. 9I and FIG. 9J, barrier film patterns 25*a* are formed by wet-etching the barrier conductive film 25 while using the resist masks 24*a* as a mask. Then, the resist masks 24*a* are removed.

As a result, the tail terminals 20 that are connected electrically to the Al-series electrode pads 14*a* via the barrier film patterns 25*a* can be obtained. The barrier film patterns 25*a* have respective functions of improving the adhesiveness between the Al-series electrode pads 14*a* and the tail terminals 20, and preventing mutual diffusions of these materials, and preventing diffusion of the solder from the solder layer to the Al-series electrode pads 14*a* side at the time of mounting.

Then, like the first embodiment, the semiconductor substrate 10 is separated into individual pieces by the dicing, and thus individual semiconductor chips each having the CSP structure can be obtained.

Then, as shown in FIG. 10, according to the same method as the first embodiment, the semiconductor chip 1*c* is mounted on the wiring substrate 30 such that the tail terminal 20 portions of the semiconductor chip 1*c* are connected electrically to the connecting pads 32 of the wiring substrate 30 via the solder layers 34.

In this case, such a mode is shown that the resin layer is not formed. However, like the first and second embodiments, such a mode may be employed that the resin layer is formed to expose the tail terminals 20 and main portions of the barrier conductive film 25.

In the semiconductor device according to the third embodiment, even if materials of the electrode pads and the tail terminals of the semiconductor device are different, the barrier conductive film is formed between the electrode pads and the tail terminals. Therefore, in addition to the similar advantages as the first embodiment, both the reliability of the semiconductor device and the reliability of the jointing to the wiring substrate can be improved.

In this case, in the semiconductor device according to the third embodiment, the case where the electrode pads and the tail terminals are formed of different material respectively is exemplified. The materials of the electrode pads and the tail terminals are not limited to the above metal materials, and other metal materials may be employed.

What is claimed is:

1. A semiconductor device having a wafer-level package structure in which CSP structures are formed at a wafer level, comprising:

a semiconductor substrate;

an electrode pad formed over the semiconductor substrate;

a tail terminal formed to have an area that is smaller than the electrode pad and connected electrically to the electrode pad, and functioning as an external connection terminal;

a barrier conductive film covering an upper surface and a side surface of the tail terminal; and a resin layer formed at a circumference of the tail terminal, the resin layer having an opening portion on an area containing the tail terminal so that a space is formed from a side surface of the tail terminal to an outside thereof.

2. A semiconductor device having a wafer-level package structure in which CSP structures are formed at a wafer level, comprising:

a semiconductor substrate;

an electrode pad formed over the semiconductor substrate;

a protection insulating film having an opening portion therein on the electrode pad;

a cap conductive film formed to bury an inside of the opening portion and connected electrically to the electrode pad;

a tail terminal formed to have an area that is smaller than the electrode pad and connected electrically to the cap conductive film, and functioning as an external connection terminal;

a barrier conductive film covering an upper surface and a side surface of the tail terminal; and a resin layer formed at a circumference of the tail terminal, the resin layer having an opening portion on an area containing the tail terminal so that a space is formed from a side surface of the tail terminal to an outside thereof.

3. A semiconductor device according to claim 1, wherein the electrode pad and the tail terminal are made of copper (Cu).

4. A semiconductor device according to claim 1, further comprising:

a barrier conductive film formed between the electrode pad and the tail terminal; and wherein the tail terminal is connected electrically to the electrode pad via the barrier conductive film.

5. A semiconductor device according to claim 4, wherein the electrode pad is composed of a metal material that is different from the tail terminal.

6. A semiconductor device having a wafer-level package structure in which CSP structures are formed at a wafer level, comprising:

a semiconductor substrate;

an electrode pad formed over the semiconductor substrate; and a tail terminal formed to have an area that is smaller than the electrode pad and connected electrically to the electrode pad, wherein the electrode pad is made of aluminum (Al) or aluminum alloy, and the barrier conductive film and the tail terminal are formed of a single film made of metal selected from a group consisting of gold (Au), platinum (Pt), and nickel (Ni), or a laminated film.

7. A semiconductor device having a wafer-level package structure in which CSP structures are formed at a wafer level, comprising:

a semiconductor substrate;

an electrode pad formed over the semiconductor substrate; and a tail terminal formed to have an area that is smaller than the electrode pad and connected electrically to the electrode pad, wherein a diameter of the tail terminal is set to ⅓ to ⅔ of a diameter of the electrode pad, and the tail terminal is formed in a portion that corresponds to a center portion of the electrode pad.

8. A semiconductor device according to claim 1, wherein the barrier conductive film includes a nickel film of 1 $\mu$m thickness, a platinum film of 1 $\mu$m thickness, and a gold film of 1 $\mu$m thickness formed in sequence from the tail terminal.

9. A semiconductor device according to claim 1, wherein the resin layer extends in a height direction beyond the tail terminal.

10. The semiconductor device according to claim 2, wherein the barrier conductive film includes a nickel film of 1 $\mu$m thickness, a platinum film of 1 $\mu$m thickness, and a gold film of 1 $\mu$m thickness formed in sequence from the tail terminal.

* * * * *

UNITED STATES PATENT AND TRADEMARK OFFICE

CERTIFICATE OF CORRECTION

PATENT NO. : 6,956,293 B2
DATED : October 18, 2005
INVENTOR(S) : Takaike, Eiji

It is certified that error appears in the above-identified patent and that said Letters Patent is hereby corrected as shown below:

Title page,
Item [73], Assignee, change "Shinko Electric Industries, Ltd." to -- Shinko Electric Industries Co., Ltd. --.

Signed and Sealed this

Fourteenth Day of March, 2006

JON W. DUDAS
*Director of the United States Patent and Trademark Office*